(12) United States Patent
Magoon et al.

(10) Patent No.: US 6,734,713 B1
(45) Date of Patent: May 11, 2004

(54) SYSTEM FOR IMPROVING THE PARASITIC RESISTANCE AND CAPACITANCE EFFECT OF A TRANSISTOR-BASED SWITCH

(75) Inventors: Rahul Magoon, Irvine, CA (US); Alyosha C. Molnar, Costa Mesa, CA (US); Jeff Zachan, Irvine, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/823,679

(22) Filed: Mar. 30, 2001

(51) Int. Cl.[7] .............................................. H03K 17/16
(52) U.S. Cl. ........................ 327/382; 327/374; 327/376
(58) Field of Search ................................. 327/382, 374, 327/376, 377, 337, 389, 50, 391, 427; 326/84

(56) References Cited

U.S. PATENT DOCUMENTS

| | | | | |
|---|---|---|---|---|
| 4,574,203 A | * | 3/1986 | Baba | 327/291 |
| 4,678,947 A | * | 7/1987 | Huijsing et al. | 327/50 |
| 4,752,703 A | * | 6/1988 | Lin | 327/391 |
| 5,204,562 A | * | 4/1993 | Pace | 327/381 |
| 5,223,751 A | * | 6/1993 | Simmons et al. | 326/81 |
| 5,323,063 A | * | 6/1994 | Chiba et al. | 327/427 |
| 5,532,630 A | * | 7/1996 | Waggoner et al. | 327/108 |
| 5,559,451 A | * | 9/1996 | Okamura | 326/84 |
| 6,281,737 B1 | * | 8/2001 | Kuang et al. | 327/382 |
| 6,380,644 B1 | * | 4/2002 | Iliasevitch | 307/130 |
| 6,605,963 B2 | * | 8/2003 | Kitamoto et al. | 326/81 |

* cited by examiner

Primary Examiner—My-Trang Nuton
Assistant Examiner—Hiep Nguyen
(74) Attorney, Agent, or Firm—Thomas, Kayden, Horstemeyer & Risley, LLP

(57) ABSTRACT

Systems for reducing the parasitic effects of a transistor-based switch are provided. In one such system provides a transistor circuit for implementing a switch having reduced parasitic effects. In general, the transistor circuit comprises a first switch node, a second switch node, a third switch node, a transistor device, and a circuit configured to reduce the parasitic characteristics of the transistor device. The first switch node is for connecting to one node of an external circuit. The second switch node is for connecting to a second node of an external circuit. The transistor device is a three-terminal device. The first terminal is connected to the first switch node. The second terminal is connected to the second switch node. The third terminal is for receiving a control signal that operates the transistor circuit as a switch by controlling the electrical connectivity between the first terminal and the second terminal. The third switch node is for receiving the control signal. The transistor circuit may also comprise an inverter circuit that is connected to the second terminal of the transistor device and is configured to provide a voltage to the second terminal when the control signal engages the transistor device.

3 Claims, 14 Drawing Sheets

SYSTEM FOR IMPROVING THE PARASITIC RESISTANCE AND CAPACITANCE EFFECT OF A TRANSISTOR-BASED SWITCH

BACKGROUND OF THE INVENTION

1. Field of the Invention

This invention is generally related to transistors for implementing switches.

2. Related Art

Transistors, such as metal-oxide-semiconductor field-effect transistors (MOSFETs), are frequently used as switching elements in integrated circuits. Because transistor-based switches are easily controlled by an input voltage and are a relatively simple and low cost solution for high-speed switching, there are a variety of situations in which they are employed. For example, transistor-based switches may be used to implement the switched capacitor tank in a voltage-controlled oscillator (VCO): In fact, the types of applications in which transistor-based switches are currently being, or will be used, or nearly infinite.

Although transistor-based switches are relatively simple and cost-effective, there are significant challenges in designing the semiconductor characteristics of the transistor. In designing transistor-based switches, the nature of the inverse relationship between resistance and capacitance, makes it difficult to minimize the overall parasitic resistance of the transistor device, while also minimizing overall capacitance of the transistor device. For example, in prior art transistor-based switches, reducing the effective parasitic resistance of the transistor device disadvantageously produces a nearly equivalent increase in the effective parasitic capacitance. Furthermore, due to parasitic effects, prior art transistor-based switches are also problematic for numerous higher frequency applications.

SUMMARY

The invention relates to systems for reducing and/or improving the parasitic effects of a transistor-based switch. In this regard, an embodiment of the invention is a transistor circuit for implementing a switch having reduced parasitic effects. In general, the transistor circuit comprises a first switch node, a second switch node, a third switch node, a transistor device, and a circuit configured to reduce the parasitic characteristics of the transistor device. The first switch node is configured to connect to one node of an external circuit. The second switch node is configured to connect to a second node of the external circuit. The transistor device is a three-terminal device. The first terminal is connected to the first switch node. The second terminal is connected to the second switch node. The third terminal is for receiving a control signal that operates the transistor circuit as a switch by controlling the electrical connectivity between the first terminal and the second terminal. The third switch node is configured to receive the control signal.

Another transistor circuit for implementing a switch having reduced parasitic effects comprises a first switch node, a second switch node, a transistor device, and an inverter circuit. The first switch node is configured to connect to one node of an external circuit. The second switch node is configured to connect to a second node of the external circuit. The transistor device is a three-terminal device. The first terminal is connected to the first switch node. The second terminal is connected to the second switch node. The inverter circuit is connected to the second terminal of the transistor device and is configured to provide a voltage to the second terminal when the control signal engages the transistor device.

The invention also provides a transistor circuit for implementing a switch having improved parasitic effects. The transistor circuit comprises a first switch node, a second switch node, a first transistor device, a second transistor device, and a third transistor device. The first switch node is configured to connect to one node in an external circuit. The second switch node is configured to connect to another node in the external circuit. The first, second, and third transistor devices are three-terminal devices. A first terminal of the first transistor device is connected to the first switch node. A third terminal of the first transistor device is configured to receive a control signal that controls the electrical connectivity between the first terminal and the second terminal. A first terminal of the second transistor device is connected to the third terminal of the first transistor device. A second terminal of the second transistor device is connected to the second switch node. A third terminal of the second transistor is configured to receive the control signal. A first terminal of the third transistor device is connected to the first terminal of the first transistor device. A second terminal of the third transistor device is connected to a second terminal of the second transistor device. A third terminal of the third transistor device is configured to receive the control signal. Importantly, the first transistor, the second transistor, and the third transistor may be configured in a predetermined manner so that the parasitic characteristics of the first transistor, the second transistor, and the third transistor result in the transistor circuit having improved parasitic characteristics.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
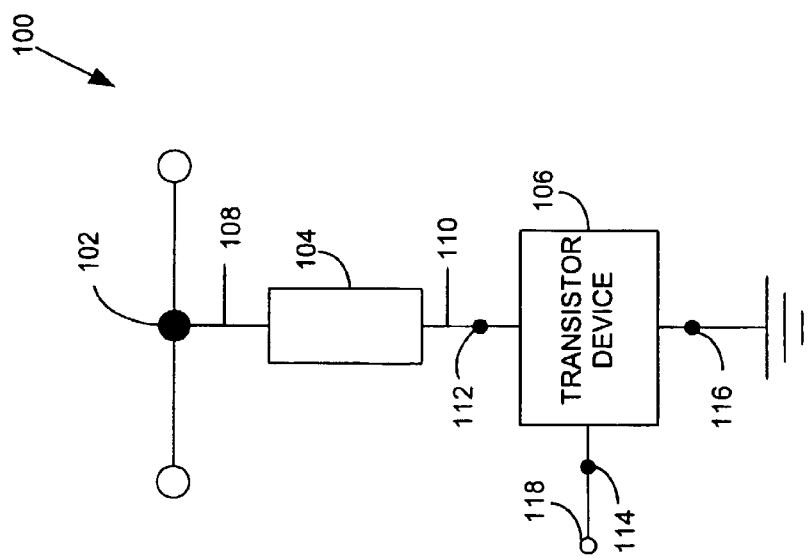
FIG. 1 is a general circuit diagram of a transistor circuit for implementing a single-ended switch.

FIG. 1 is a general circuit diagram of a transistor circuit 100 for implementing a single-ended switch. Transistor circuit 100 comprises a circuit element 104 and a transistor device 106. Circuit element 104 may be connected to circuit node 102 of, for example, an analog integrated circuit, by connection 108 and to a first terminal 112 of transistor device 106 by connection 110. A second terminal 116 of transistor device 106 may be connected to ground. A third terminal 114 of transistor device 106 may be connected to a switch terminal 118 that receives an electrical signal configured to enable or disable transistor device 106. When transistor device 106 is enabled as a switch by the electrical signal on switch terminal 118, circuit node 102 realizes the circuit element 104. When transistor device 106 is disabled as a switch by the electrical signal on switch terminal 118, circuit node 102 does not realize circuit element 104.

As known by one of ordinary skill in the art, circuit element 104 may be any type of circuit element and transistor device 106 may be any type of transistor device configured to operate as a switch. For example, transistor device 106 may be a bipolar junction transistor (BJT), such as a pnp BJT (principal conduction by positive holes) or a npn BJT (principal conduction by negative electrons), a field-effect transistor (FET), such as a junction field-effect transistor (JFET) or a metal-oxide-semiconductor field-effect transistor (MOSFET), or any similarly configured BJT or FET device.

Circuit element 104 may be a single circuit element, such as a capacitor, resistor, or other circuit element or electronic device, or a collection of circuit elements. Furthermore, transistor circuit 100 may be used in numerous situations for implementing a switch. For example, transistor circuit 100 may be used in analog integrated circuits within a switched capacitor tank in a voltage-controlled oscillator.

Figure 2:
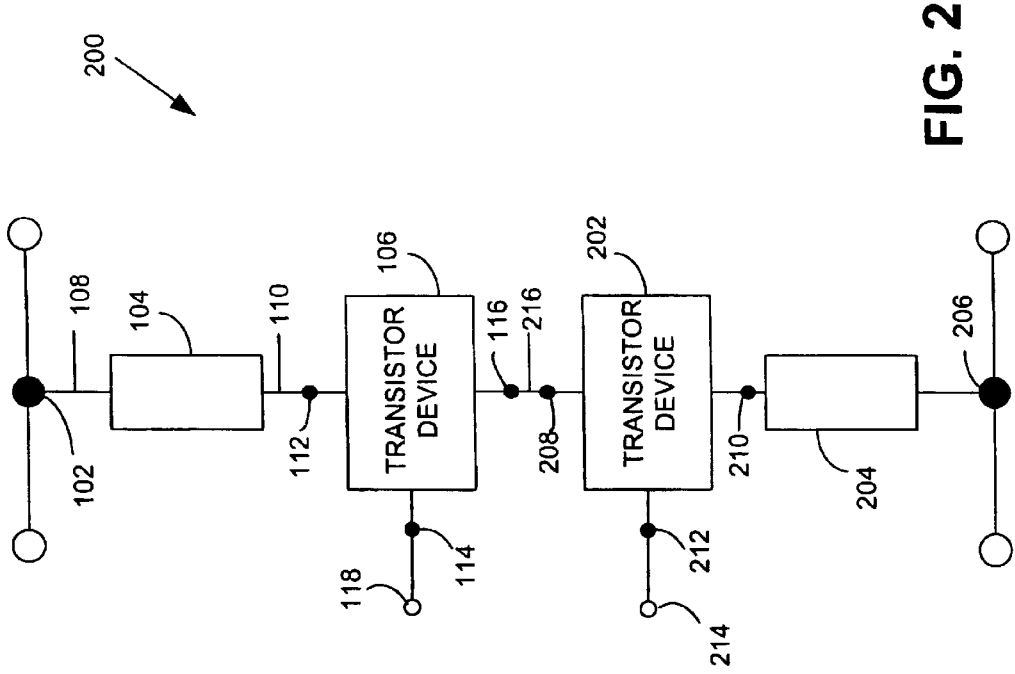
FIG. 2 is a general circuit diagram of a transistor circuit for implementing a differential switch.

FIG. 2 is a general circuit diagram of a transistor circuit 200 for implementing a differential switch. Transistor circuit 200 is similar to transistor circuit 100 of FIG. 1, but further comprises a transistor device 202, a circuit element 204, and a circuit node 206. A first terminal 208 of transistor device 202 may be connected to second terminal 116 of transistor device 106 at a virtual ground connection 216. As known in the art, transistor devices 106 and 202 may be configured as mirror images of each other because a differential switch is implemented. A second terminal 210 of transistor device 202 may be connected to circuit element 204. A third terminal of transistor device 202 may be connected to a switch terminal 214. The additional components of transistor circuit 202 may be configured, and operate, in the same manner as described above with respect to transistor circuit 100 (FIG. 1).

Figure 3:
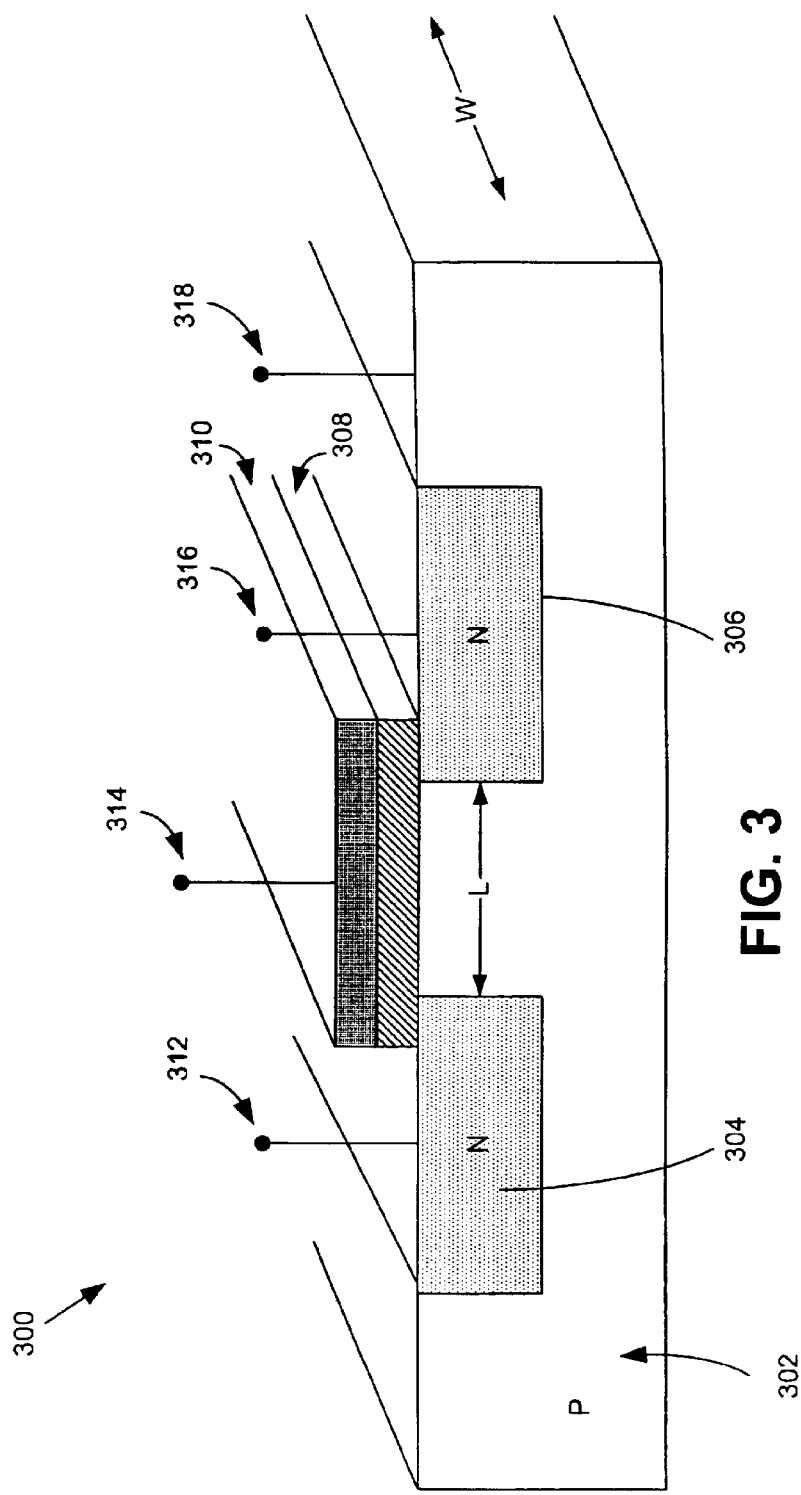
FIG. 3 is a schematic view of an n-channel metal-oxide-semiconductor field-effect transistor (MOSFET) that may be used to implement the transistor devices of FIGS. 1 and 2.

As stated above, transistor devices 106 and 202 may be any type of transistor device. FIG. 3 illustrates an example of a perspective view of one of many such devices. FIG. 3 is a perspective view of an n-channel metal-oxide-semiconductor field-effect transistor (MOSFET) 300 which may be used to implement transistor devices 106 and 202 of FIGS. 1 and 2. MOSFET 300 is fabricated on a p-type substrate, or bulk, 302 having a width (W), which may be a single-crystal silicon wafer that provides physical support for MOSFET 300. MOSFET 300 also comprises two heavily-doped n-type regions separated by a length (L), a source 304 and a drain 306, which may be created within bulk 302. An insulator 308 may also be fabricated on the surface of the bulk, covering the area between source 304 and drain 306. Insulator 308 may be a thin layer of silicon dioxide ($SiO_2$) or any other suitable substance that is an electrical insulator. A gate 310 is formed on the top of insulator 308. Gate 310 may be a heavily-doped piece of polysilicon or other similar conducting substance. MOSFET 300 may also include a source terminal (S) 312, a gate terminal (G) 314, a drain terminal (D), and a bulk terminal (B) 318 for connecting the respective portions of MOSFET 300 to other circuit nodes.

Figure 4:
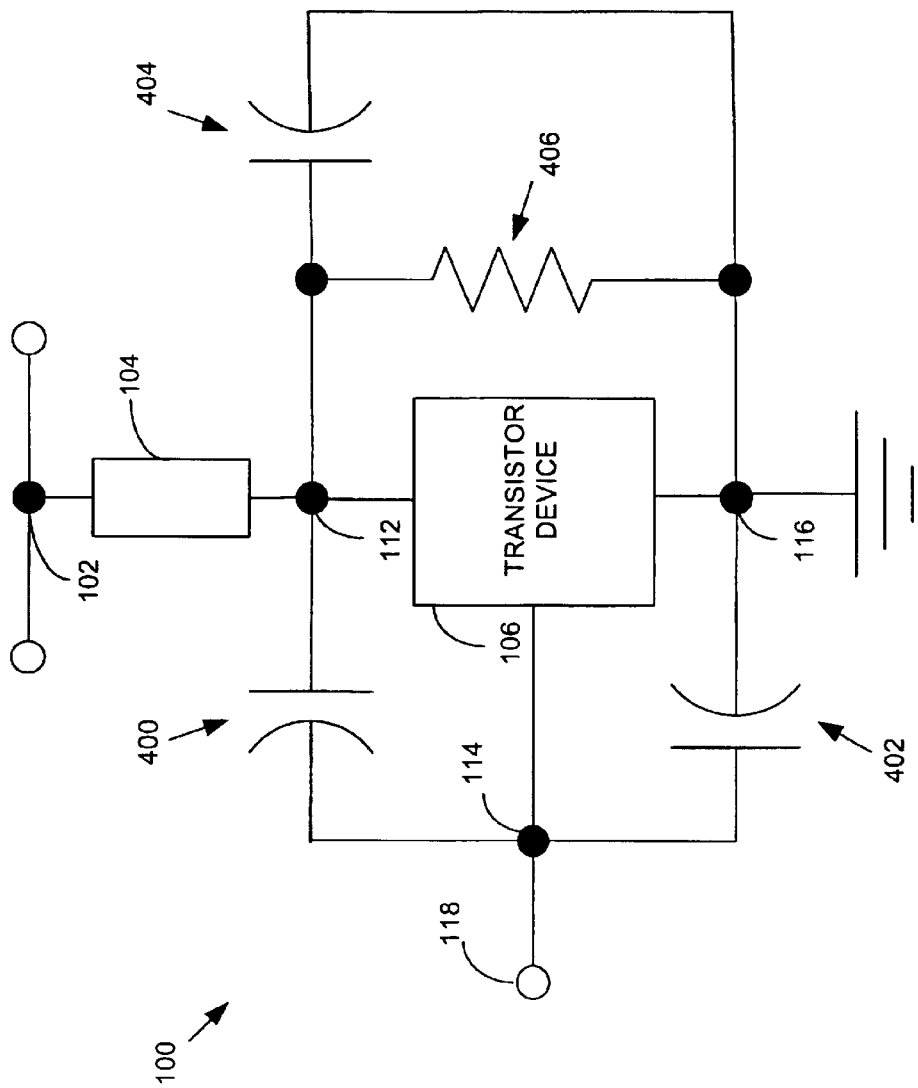
FIG. 4 is a circuit diagram of the transistor circuit of FIG. 1 illustrating the parasitic effects of the transistor device.
Figure 5:
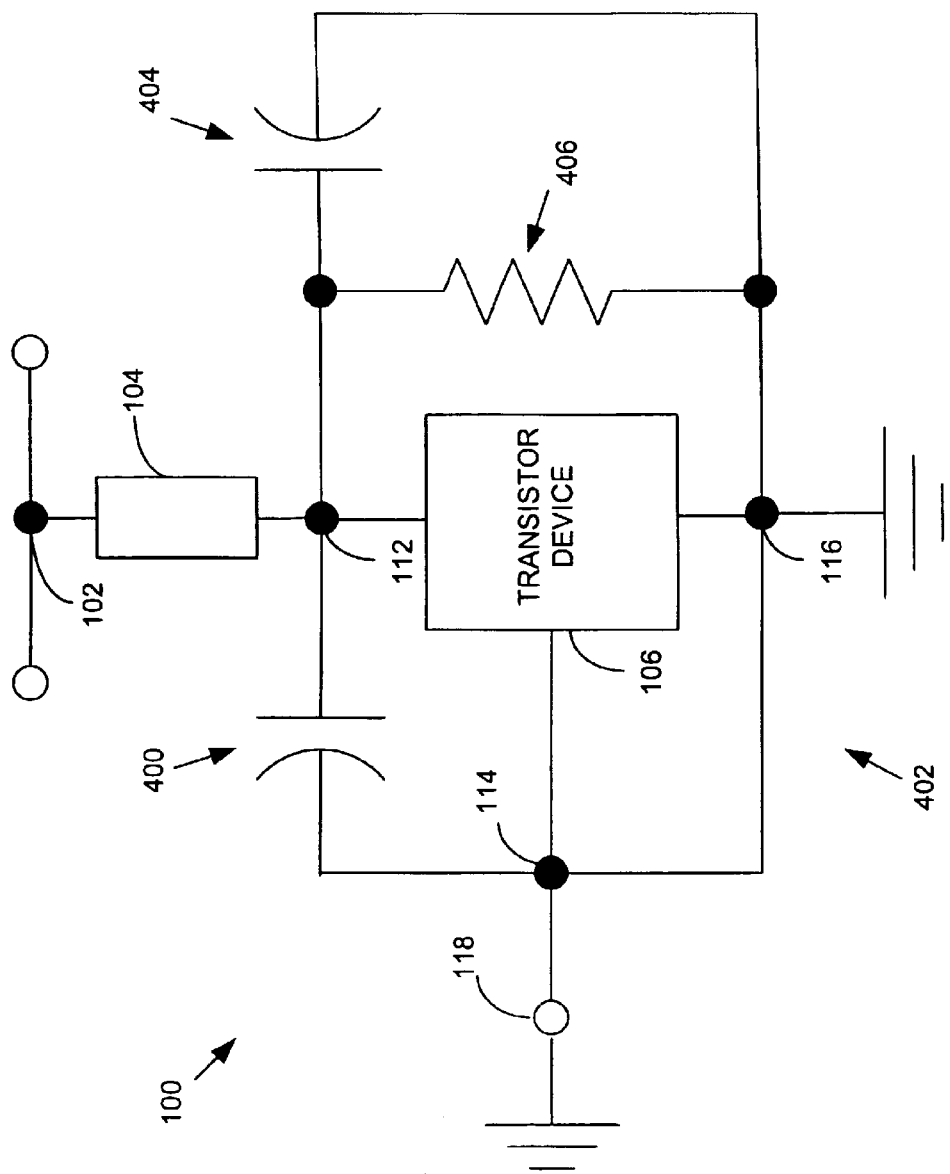
FIG. 5 is an AC-simplified circuit diagram of the circuit of FIG. 5.

FIG. 4 is a circuit diagram of transistor circuit 100 that illustrates the high-frequency response of transistor device 106 when a bias voltage ($V_G$) is applied to terminal 114 by switch terminal 118. As known in the art, when transistor device 106 is enabled as a switch, the semiconductor characteristics of transistor device 106 produce some parasitic capacitance, represented by capacitors 400, 402, and 404, and a parasitic resistance, referred to as "on-resistance," represented by resistor 406. Capacitor 400 represents the capacitance resulting from the capacitor formed between first terminal 112 and third terminal 114. For example, where transistor device 106 is implemented using an n-channel MOSFET, capacitor 400 may represent the capacitance between gate terminal 314 and drain terminal 316 (FIG. 3). Capacitor 402 represents the capacitance resulting from the capacitor formed between third terminal 114 and second terminal 116. Again, where transistor device 106 is implemented using an n-channel MOSFET, capacitor 402 may represent the capacitance between gate terminal 314 and source terminal 312 (FIG. 3). Capacitor 404 represents the capacitance resulting from the capacitor formed between first terminal 112 and the bulk of the MOSFET. Resistor 406 represents the effective resistance of the channel between first terminal 112 and second terminal 116. Where transistor device 106 is implemented using an n-channel MOSFET, resistor 406 may represent the resistance between source terminal 312 and drain terminal 316 (FIG. 3). An AC-simplified diagram of the circuit is illustrated in FIG. 5. As known in the art, in a high-frequency analog circuit, the bias voltage presented to switch terminal 118 is electrically an AC ground, which removes capacitor 402.

Figure 6:
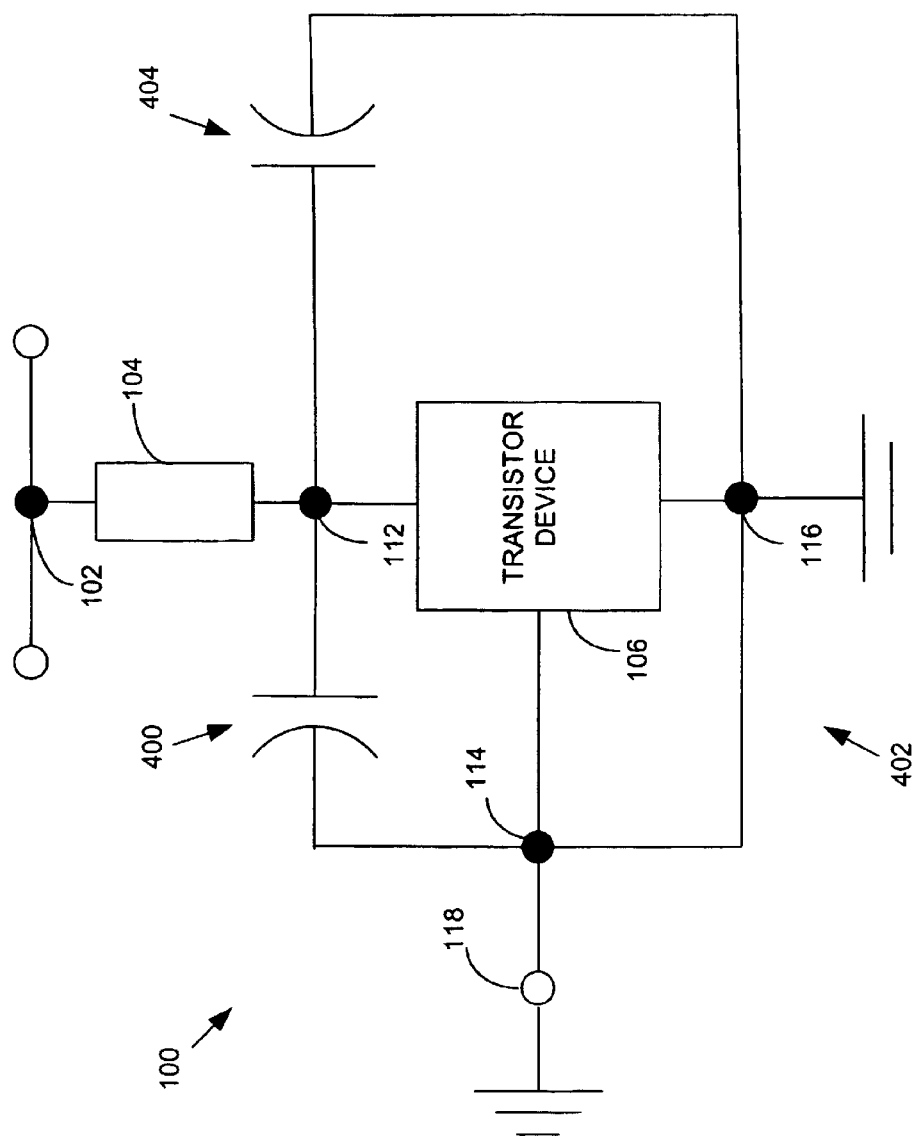
FIG. 6 is an AC-simplified circuit diagram of the transistor circuit of FIG. 1 illustrating the parasitic effects of the transistor device when not enabled as a switch.

FIG. 6 is an AC-simplified circuit diagram of transistor circuit 100 of FIG. 1 that illustrates the high-frequency response of the circuit when no bias voltage ($V_G$) terminal 114 by switch terminal 118. As illustrated in FIG. 6, when transistor device 106 is disabled as a switch, only the parasitic capacitance represented by capacitors 400 and 404 are produced by transistor device 106. It should be noted that the values for capacitors 400 and 404 may vary as transistor device 106 is enabled and disabled.

Figure 7:
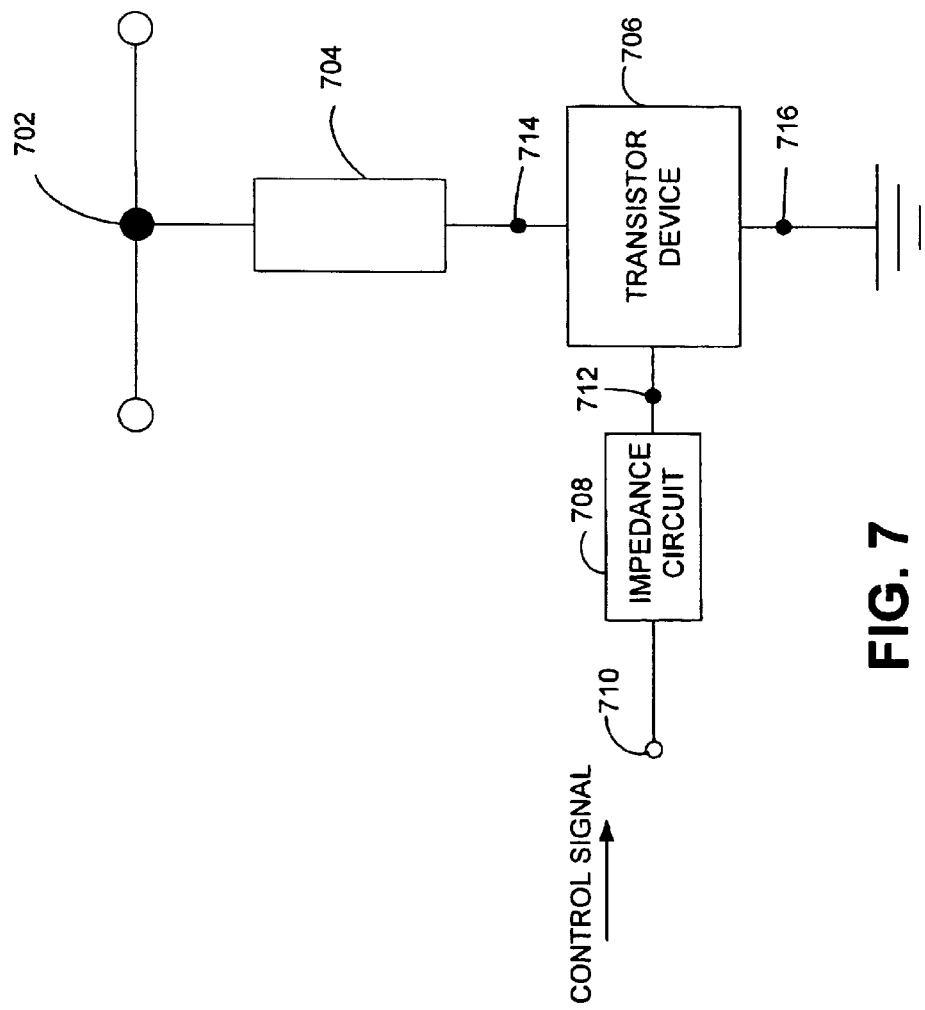
FIG. 7 is a circuit diagram of one of a number of embodiments of a transistor circuit.

FIG. 7 is a circuit diagram of one of a number of embodiments of a transistor circuit 700. Transistor circuit 700 comprises circuit node 702, circuit element 704, transistor device 706, impedance element 708, and switch terminal 710. Transistor device 706 comprises a first terminal 712, a second terminal 714, a third terminal 716, and a bulk 718 (not shown). Typically, bulk 718 is connected to an AC ground. First terminal 712 maybe connected to switch terminal 710 through impedance element 708. Second terminal 714 of transistor device 706 may be connected to circuit element 704, which is further connected to circuit node 702. Third terminal 716 may be connected to ground. In other embodiments where a differential switch is implemented, third terminal 716 may connected to another transistor circuit configured similar to transistor circuit 700.

As known by one of ordinary skill in the art, circuit element 704 may be any type of circuit element and transistor device 706 may be any type of transistor device configured to operate as a switch. For example, transistor device 706 may be a bipolar junction transistor (BJT), such as a pnp BJT (principal conduction by positive holes) or a npn BJT (principal conduction by negative electrons), or a field-effect transistor (FET), such as a junction field-effect transistor (JFET), a metal-oxide-semiconductor field-effect transistor (MOSFET), or any other similarly configured FET or BJT. Circuit element 704 may be a single circuit element, such as a capacitor, resistor, or other circuit element or electronic device, or a collection of circuit elements.

Furthermore, impedance element 708 may be any type of circuit element, such a resistor or other circuit element or electronic device, or collection of circuit elements or electronic devices having a desired impedance. As will be described in detail below, the important aspect of impedance element 708 is that the characteristic impedance is selected to reduce the parasitic effects of transistor device 706. The characteristic impedance of impedance element 708 should be high enough to prevent switch terminal 710 from functioning as an AC ground to transistor device 706. In other words, impedance element 708 should be configured to reduce parasitic capacitance formed between first terminal 712 and third terminal 716.

Figure 8:
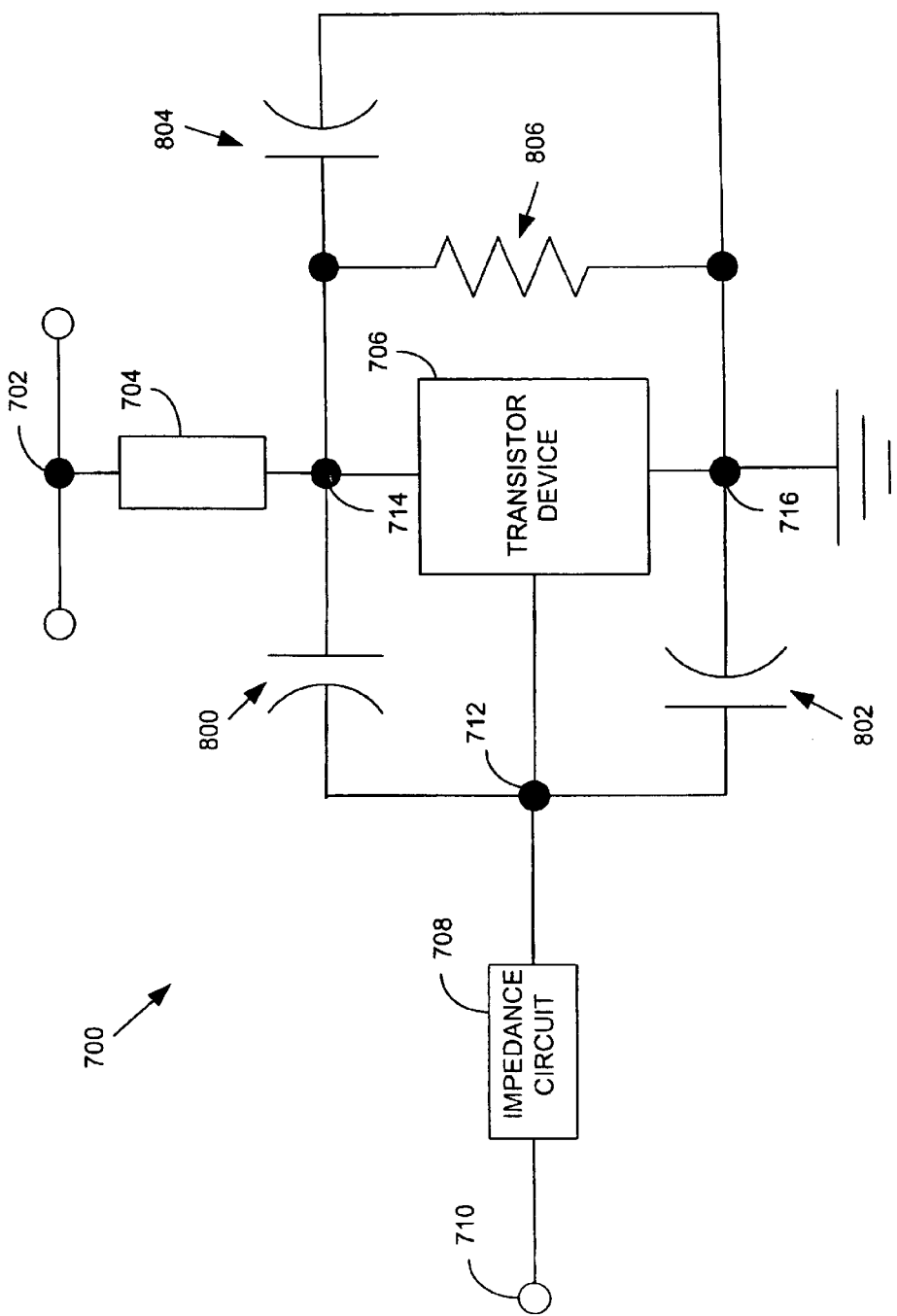
FIG. 8 is a circuit diagram of the transistor circuit of FIG. 7 illustrating the parasitic effects of the transistor device when enabled as a switch.

FIG. 8 is a circuit diagram of transistor circuit 700 that illustrates the parasitic capacitance and resistance resulting where transistor 706 is enabled as a switch by a bias voltage applied to switch terminal 710. Capacitor 800 represents the capacitance resulting from the capacitor formed between first terminal 712 and second terminal 714 of transistor device 706 (C1,2). Capacitor 802 represents the capacitance resulting from the capacitor formed between first terminal 712 and third terminal 716 (C1,3). Capacitor 804 represents the capacitance resulting from the capacitor formed between second terminal 714 and bulk 718 (C2,B) (not shown). Resistor 806 represents the effective resistance of the channel between second terminal 714 and third terminal 716.

Figure 9:
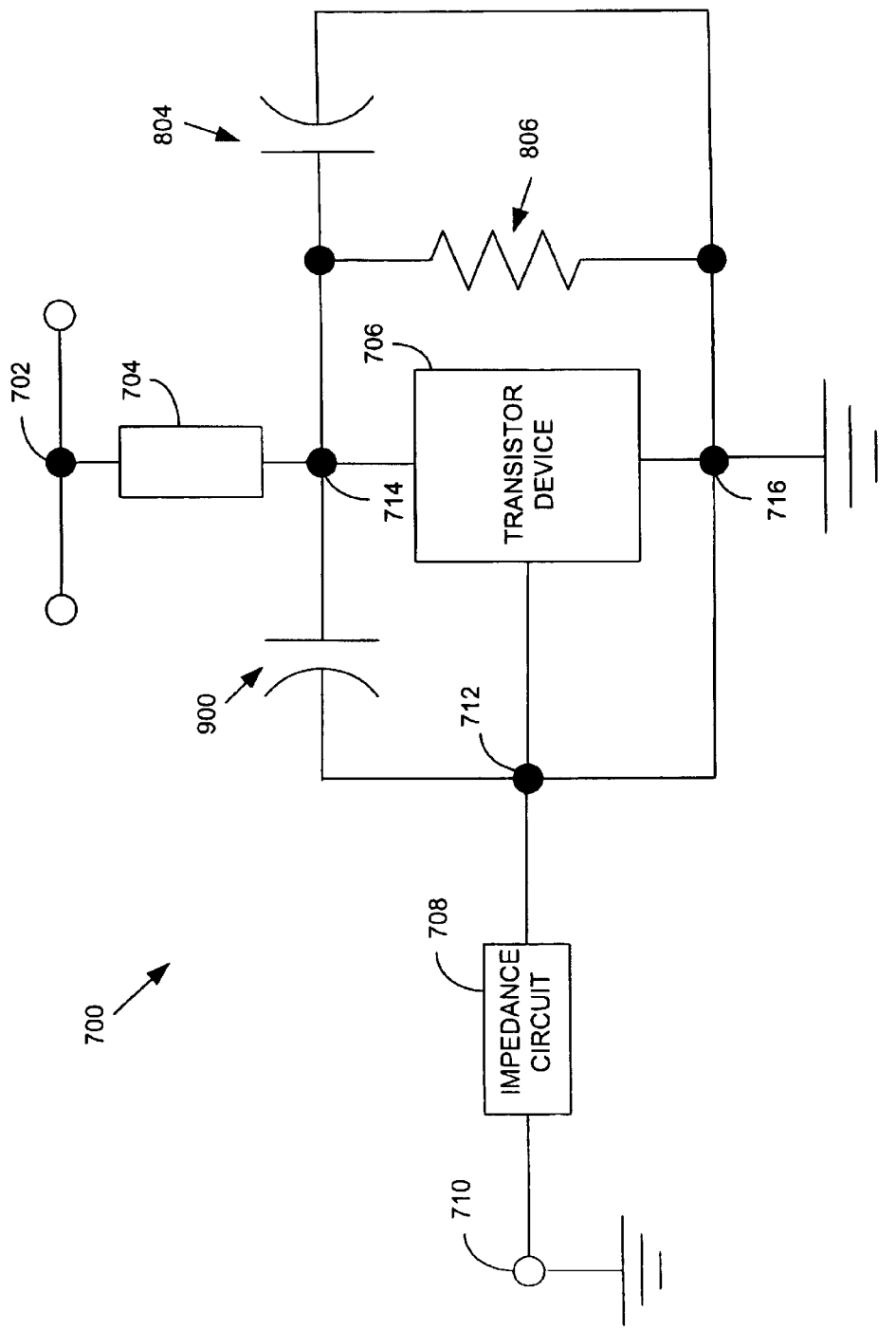
FIG. 9 is an AC-simplified circuit diagram of the transistor circuit of FIG. 8.

As stated above, in prior art transistor circuits for implementing a switch, the switch node that generates the bias voltage for the transistor device is viewed as an electrical AC ground, and therefore, removes the capacitance (capacitor 402, FIG. 4) between terminal 114 and terminal 116 (FIG. 4). Without this capacitance, the overall parasitic capacitance is increased. As illustrated in FIG. 9, the presence of impedance element 708 in transistor circuit 700 creates an AC open at switch terminal 710 instead of an AC short as in the prior art. Therefore, capacitor 800 and 802 are connected in series, and can be simplified to a capacitor 900 having a capacitance (Cseries) defined by the following equation:

$$Cseries = \frac{(C1,3)(C1,2)}{C1,3 + C1,2} \quad \text{(Equation 1)}$$

Figure 10:
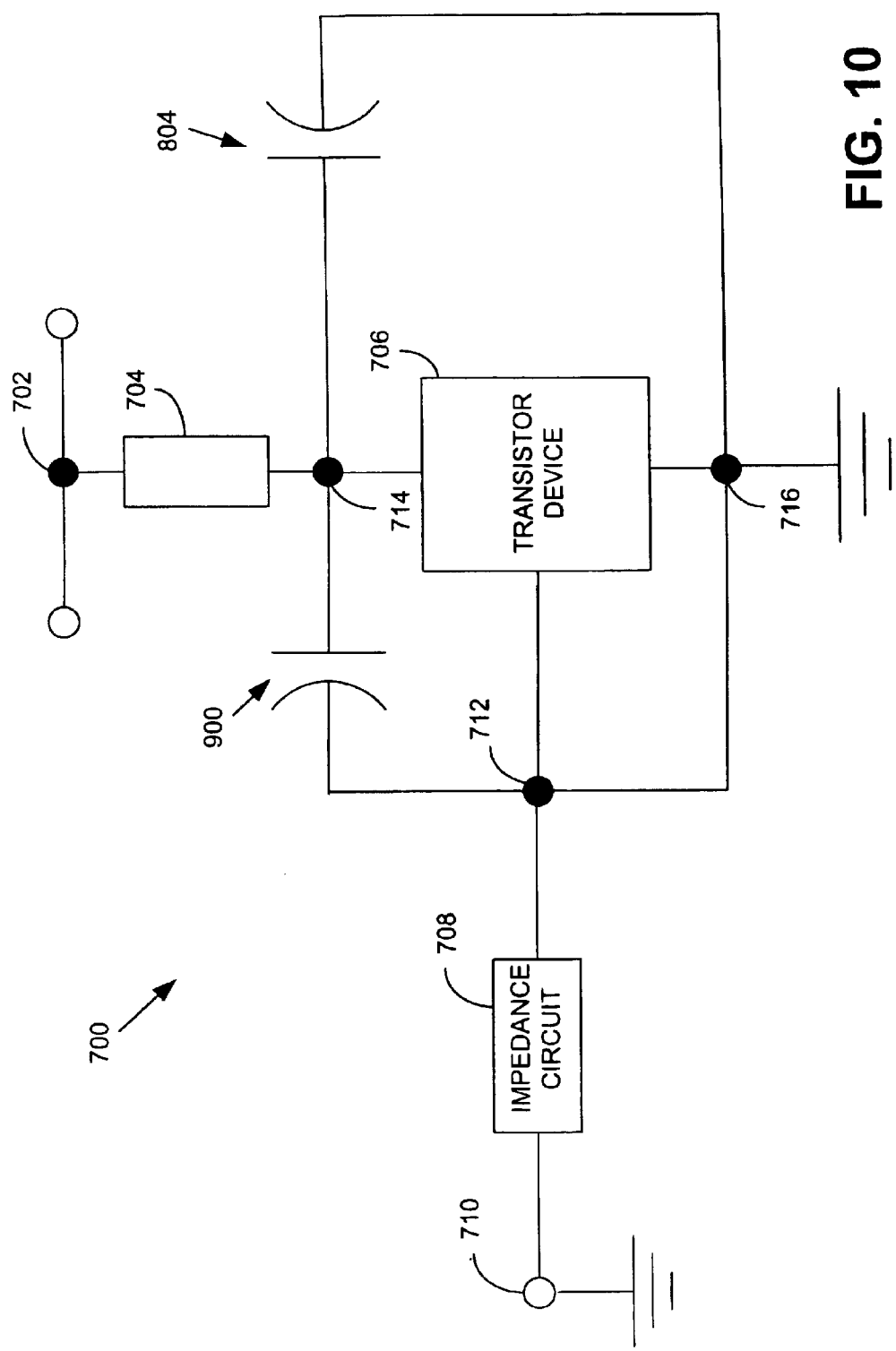
FIG. 10 is an AC-simplified circuit diagram of the transistor circuit of FIG. 7 that illustrates the parasitic effects of the transistor device not enabled as a switch.

FIG. 10 is an AC-simplified circuit diagram of transistor circuit 700 that illustrates the parasitic capacitance resulting when transistor device 706 is not enabled as a switch. Where no bias voltage is applied to switch terminal 710 resistor 706 is not present and only capacitors 900 and 804 remain.

Figure 11:
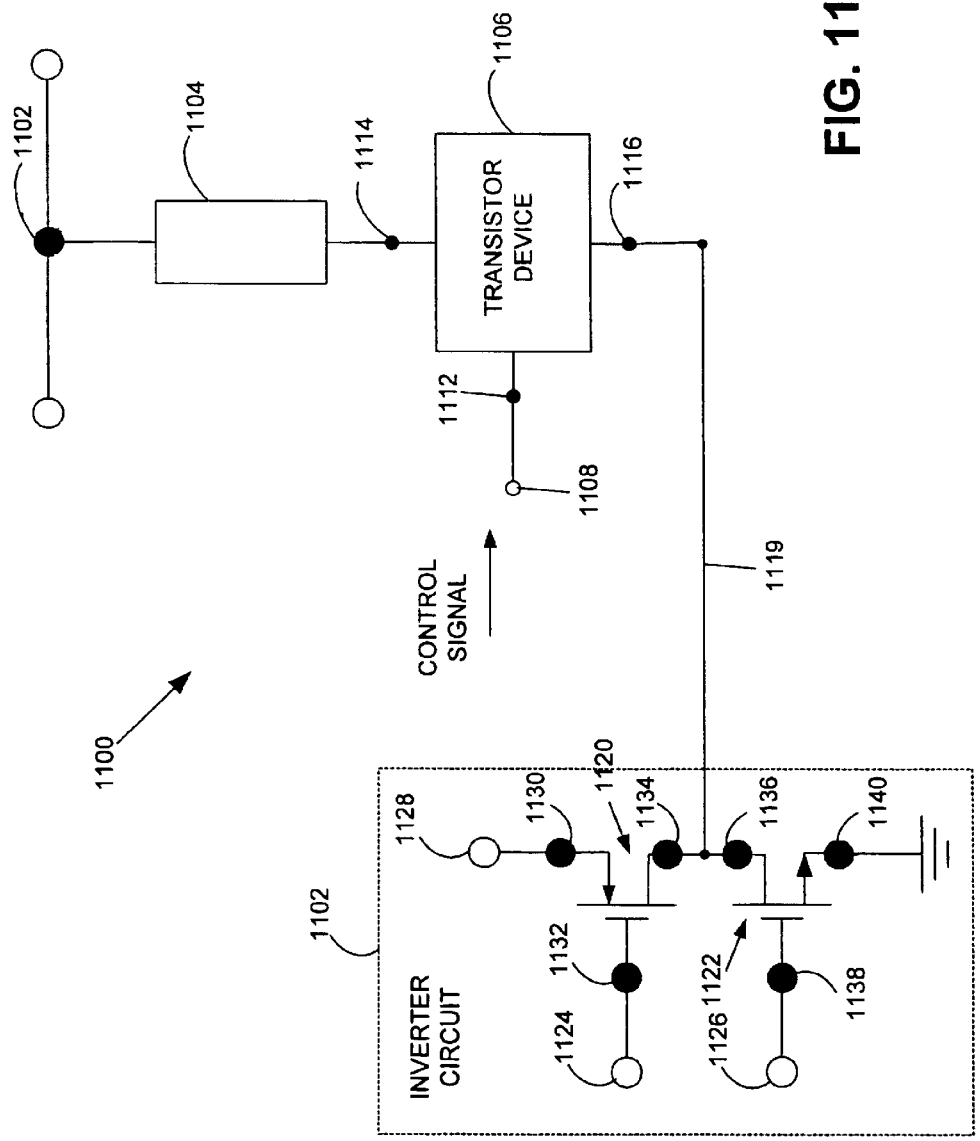
FIG. 11 is a circuit diagram of another of a number of embodiments of a transistor circuit.

FIG. 11 is a circuit diagram of another of a number of embodiments of a transistor circuit 1100. Transistor circuit 1100 comprises circuit node 1102, circuit element 1104, transistor device 1106, switch terminal 1108, and inverter circuit 1102. Transistor device 1106 comprises a first terminal 1112, a second terminal 1114, a third terminal 1116, and a bulk 1118 (not shown). First terminal 1112 may be connected to switch terminal 1108. In other embodiments, first terminal 1112 may be connected to switch terminal 1108 through an impedance element as described above. Second terminal 1114 of transistor device 1106 may be connected to circuit element 1104, which is further connected to circuit node 1102. In other embodiments where a differential switch is implemented, third terminal 1116 may connected to another transistor circuit configured similar to transistor circuit 1100. Third terminal 1116 is also connected to inverter circuit 1102 by connection 1119.

As known by one of ordinary skill in the art, circuit element 1104 may be any type of circuit element and transistor device 1106 may be any type of transistor device configured to operate as a switch. For example, transistor device 1106 may be a bipolar junction transistor (BJT), such as a pnp BJT (principal conduction by positive holes) or a npn BJT (principal conduction by negative electrons), a field-effect transistor (FET), such as a junction field-effect transistor (JFET) or a metal-oxide-semiconductor field-effect transistor (MOSFET), or any other similarly configured BJT or FET. Circuit element 1104 may be a single circuit element, such as a capacitor, resistor, or other circuit element or electronic device, or a collection of circuit elements.

As known in the art, inverter circuit 1102 may be configured in numerous ways. For example, inverter circuit 1102 may be configured as taught by Adel S. Sedra and Kenneth C. Smith in "Microelectronic Circuits" (3d. Edition), or as taught by Bezhad Razavi in "Design of Analog CMOS Integrated Circuits," which are both incorporated in their entirety by reference.

FIG. 11 illustrates one of a number of embodiments for implementing inverter circuit 1102. For example, inverter circuit 1102 may comprise transistor devices 1120 and 1122, switch terminals 1124 and 1126, and voltage source (Vcc) terminal 1128. Transistor device 1120 may be connected to voltage source terminal 1128 by a first terminal 1130. Transistor device 1120 may be to switch terminal 1124 by a second terminal 1132. A third terminal 1134 of transistor device 1120 may be connected to connection 1119. A first terminal of 1136 of transistor device 1122 may also be connected to connection 1119. Transistor device 1122 may be connected to switch terminal 1126 by a second terminal 1138. A third terminal 1140 of transistor device. 1122 may be grounded.

The important aspect of inverter circuit 1102 is that when a voltage bias is applied to switch terminals 1108, 1124, and 1126, inverter circuit 1102 pulls connection 1119 to ground. On the other hand, when no voltage bias is applied to switch nodes 1108, 1124, and 1126, inverter circuit 1102 pulls connection 1119 to the voltage (Vcc) applied to voltage source terminal 1128.

In prior art transistor circuits, the two transistor devices comprising the transistor circuit may begin to forward conduct from the bulk to one of the terminals where no bias voltage is applied and where a large voltage swing is preset, such as, for example, in a voltage-controlled oscillator. This forward conduction from the bulk to one of the terminals may inject undesirable noise into the circuit. In transistor circuit 1100, when no bias voltage is applied to switch nodes 1108, 1124, and 1126, the presence of inverter circuit 1102 increases the voltage at third terminal 1116 of transistor device 1106 due to connection 1119 being pulled to Vcc, thereby preventing forward conduction from the bulk (not shown) to third terminal 1116. When a bias voltage is applied, the presence of inverter circuit 1102 merely pulls connection 1119 to ground.

Figure 12:
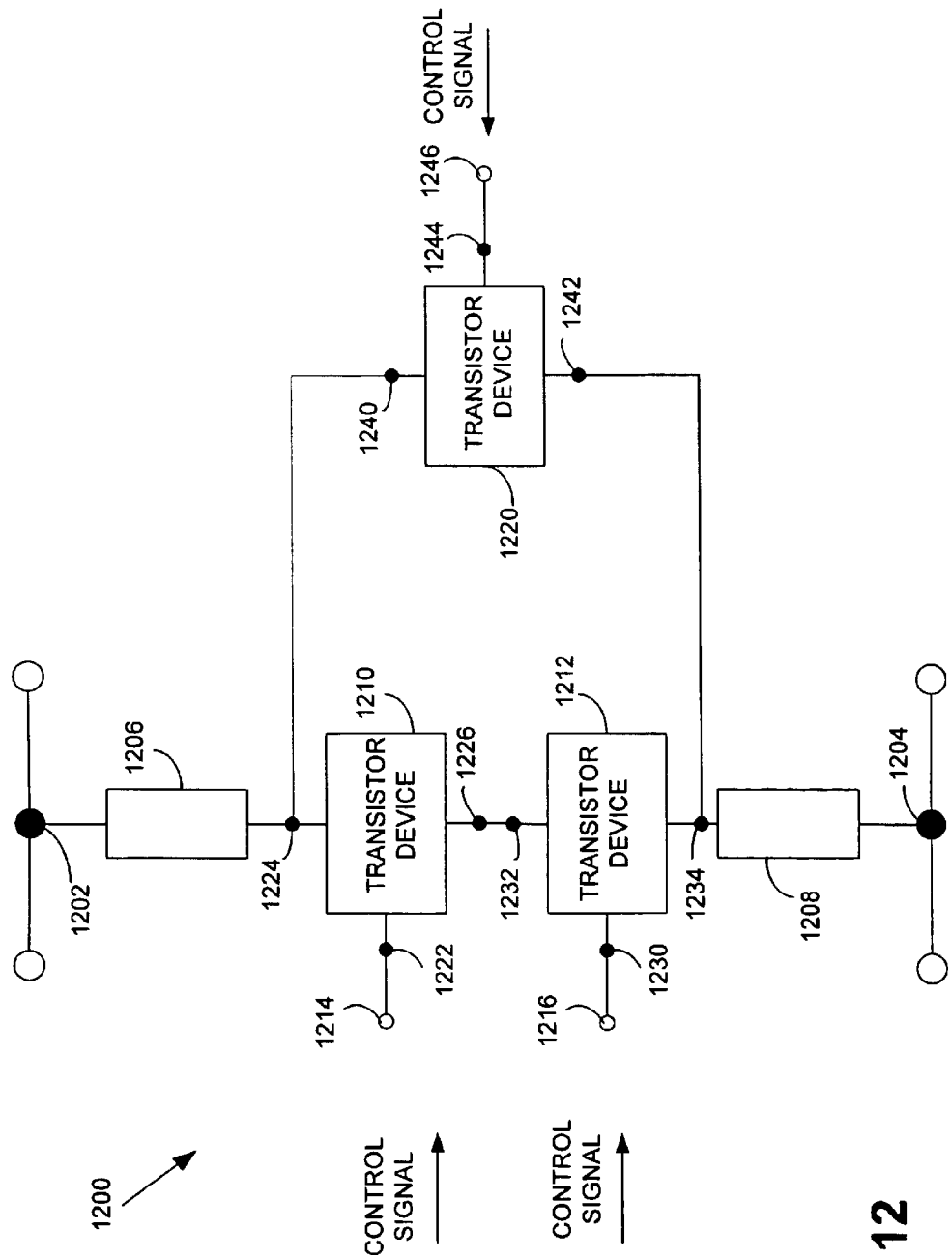
FIG. 12 is a circuit diagram of yet another of a number of embodiments of a transistor circuit.

FIG. 12 is a circuit diagram of yet another of a number of embodiments of a transistor circuit. Transistor circuit 1200 may comprise circuit nodes 1202 and 1204, circuit elements 1206 and 1208, transistor devices 1210 and 1212, switch terminals 1214 and 1216, and transistor device 1220. Transistor device 1210 comprises a first terminal 1222, a second terminal 1224, a third terminal 1226, and a bulk 1228 (not shown). Transistor device 1212 comprises a first terminal 1230, a second terminal 1232, a third terminal 1234, and a bulk 1236 (not shown).

Terminal 1222 of transistor device 1210 is connected to switch terminal 1214. In other embodiments, terminal 1222 may be connected to switch terminal 1214 through an impedance element as described above. Terminal 1224 of transistor device 1210 is connected to circuit element 1206, which is further connected to circuit node 1202. Terminal 1224 may also be connected to a first terminal 1240 of transistor device 1220. Terminal 1226 of transistor device 1210 is connected to terminal 1232 of transistor device 1212. Terminal 1230 of transistor device 1212 is connected to switch terminal 1216. In other embodiments, terminal 1222 may be connected to switch terminal 1214 through an impedance element as described above. Terminal 1234 of transistor device 1212 is connected to circuit element 1208, which is further connected to circuit node 1204. Terminal 1234 may also be connected to a second terminal 1242 of transistor device 1220. A third terminal 1244 of transistor device 1220 may be connected to a switch terminal 1246.

It should be understood by one of ordinary skill in the art that there are various alternative embodiments of transistor circuit 1200. In some alternative embodiments, transistor circuit may be implemented with inverter circuit 1102 as described above.

Figure 13:
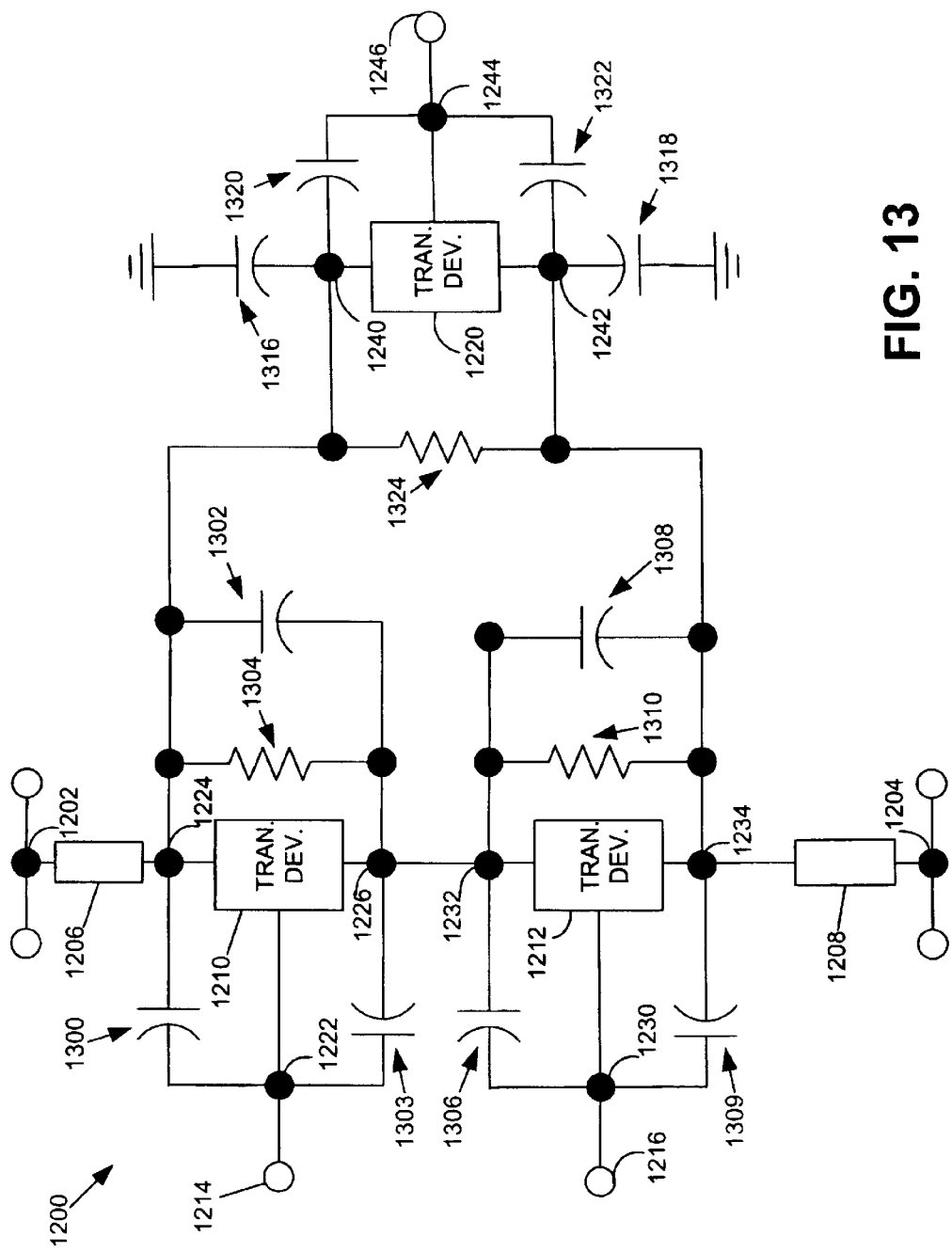
FIG. 13 is a circuit diagram of the transistor circuit of FIG. 12, which illustrates the parasitic effects of each of the transistor devices.

FIG. 13 is a circuit diagram of transistor circuit 1200 of FIG. 12, which illustrates the parasitic capacitance and resistance resulting where transistor devices 1210, 1212, and 1220 are enabled as switches. With respect to transistor device 1210, capacitor 1300 represents the effective capacitance resulting from the capacitor formed between terminals 1222 and 1224. Capacitor 1302 represents the capacitance resulting from the capacitor formed between terminal 1224 and bulk (not shown). Capacitor 1303 represents the capacitance resulting from the capacitor formed between terminal 1222 and 1225. Resistor 1304 represents the effective resistance of the channel between terminals 1224 and 1226.

With respect to transistor device 1212, capacitor 1306 represents the effective capacitance resulting from the capacitor formed between terminals 1232 and 1230. Capacitor 1308 represents the capacitance resulting from the capacitor formed between terminal 1232 and bulk (not shown). Capacitor 1309 represents the capacitance formed between terminals 1230 and 1234. Resistor 1310 represents the effective resistance of the channel between terminals 1232 and 1234.

With respect to transistor device 1220, capacitor 1316 represents the effective capacitance resulting from the capacitor formed between terminal 1240 and bulk (not shown). Capacitor 1318 represents the effective capacitance resulting from the capacitor formed between terminal 1242 and bulk (not shown). Capacitor 1320 represents the capacitance resulting from the capacitor formed between terminals 1240 and 1244. Capacitor 1322 represents the capacitance resulting from the capacitor formed between terminals 1242 and 1244. Resistor 1324 represents the effective resistance of the channel between terminals 1240 and 1242.

Figure 14:
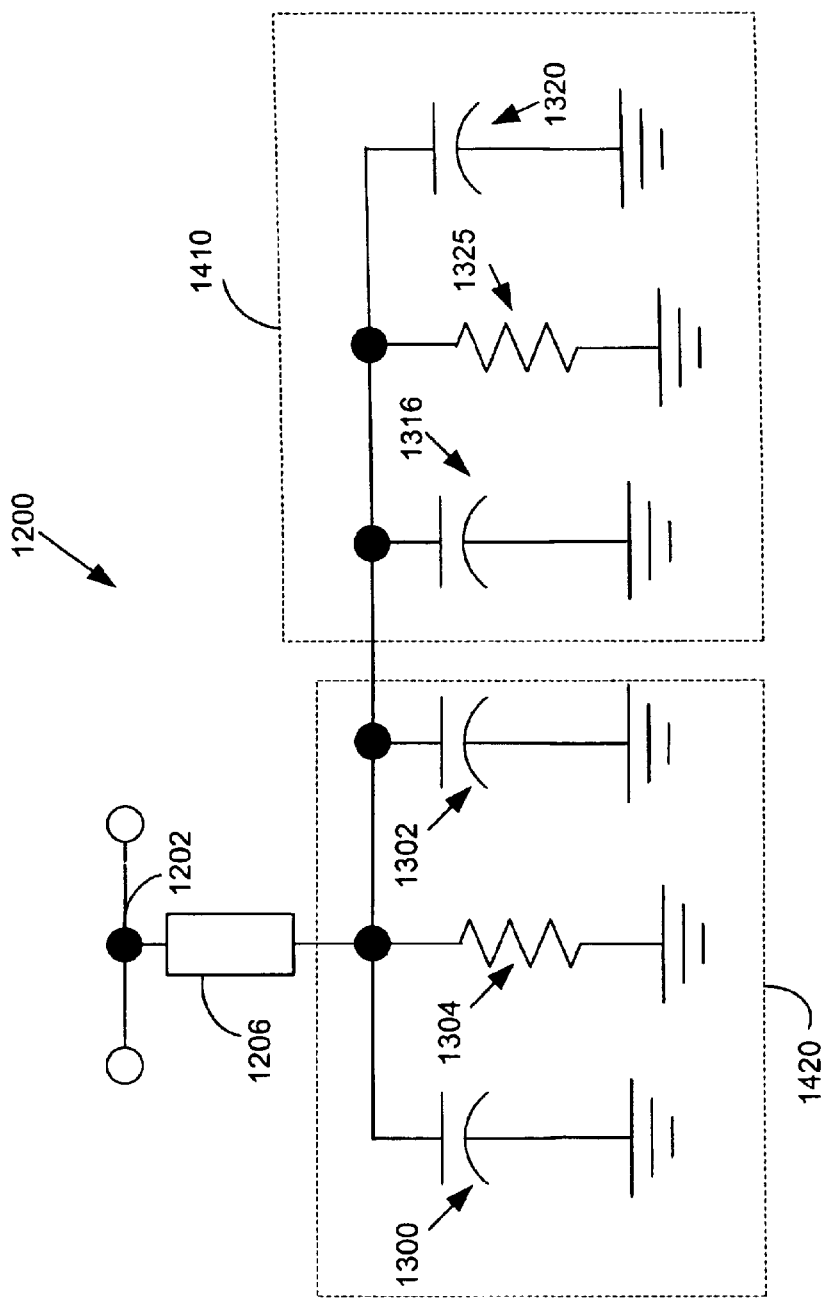
FIG. 14 is a differential half-circuit diagram of the transistor circuit of FIG. 13.

With reference to FIG. 14, the benefits of transistor circuit 1200 will be described. FIG. 14 illustrates an equivalent differential half-circuit diagram of transistor circuit 1200, which includes the parasitic capacitance and resistance for transistor devices 1210 and 1220. Block 1420 represents the parasitic capacitance and resistance for transistor device 1210, which comprises capacitor 1300, resistor 1304, and capacitor 1302. Block 1410 represents the parasitic capacitance and resistance for transistor device 1220, which comprises capacitor 1316, resistor 1325, and capacitor 1320. As known in the art, resistor 1325 has one-half the resistance of resistor 1324 (FIG. 13) because it is a differential half-circuit diagram.

Figure 16:
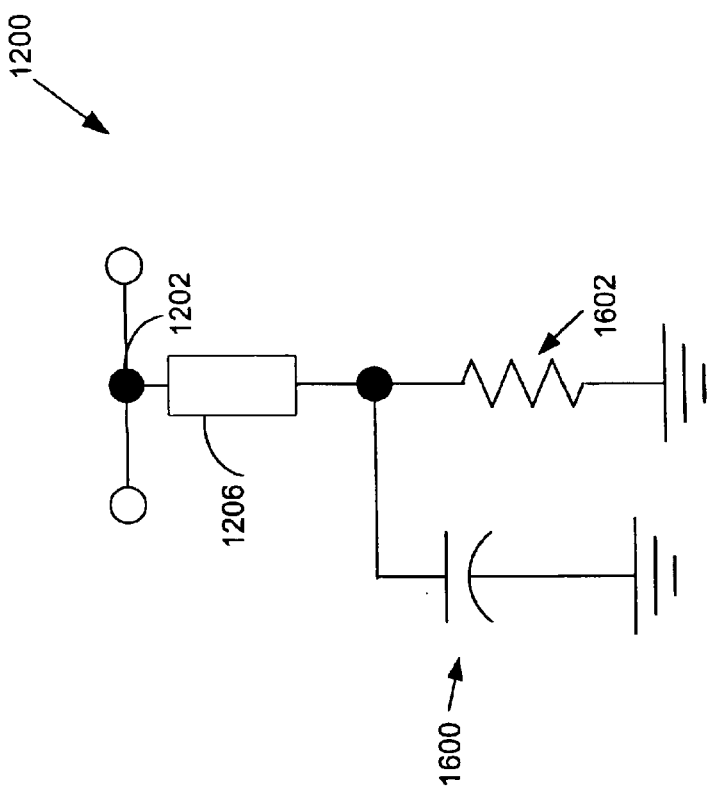
FIG. 16 is simplified circuit diagram of FIG. 14.
Figure 15:
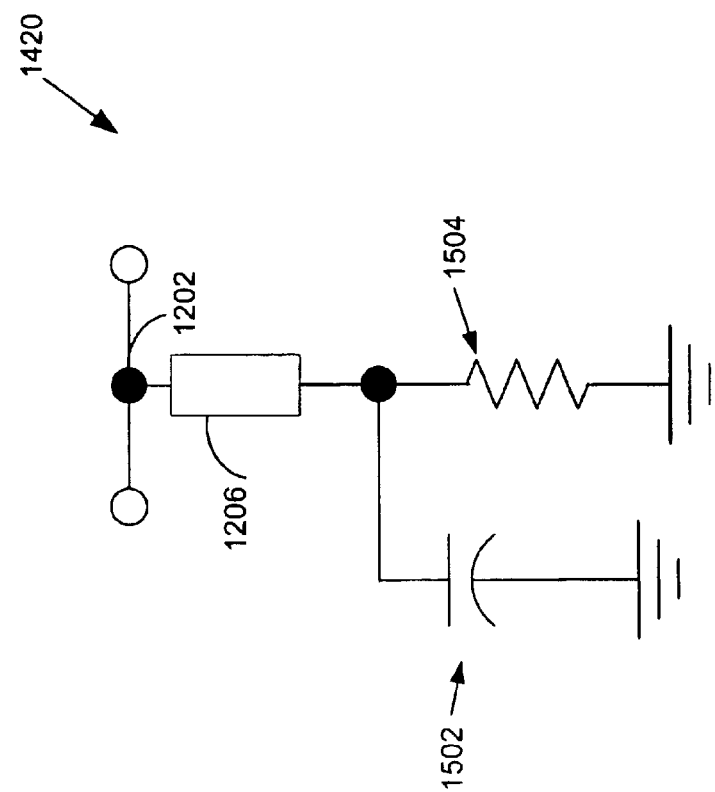
FIG. 15 is simplified circuit diagram of a portion of FIG. 14.

FIG. 15 is a simplified circuit diagram of the portion of the diagram of FIG. 14 within block 1420. Block 1420 may reduce to a capacitor 1502 and a resistor 1504. FIG. 16 is a simplified circuit diagram of the entire diagram of FIG. 14 for transistor circuit 1200, including both blocks 1410 and 1420. Transistor circuit 1200 may reduce to a capacitor 1600, a resistor 1602. Where transistor devices 1210 and 1220 are fabricated equivalently, we can assume that the electrical characteristics and the corresponding parasitic capacitance and resistance for transistor devices 1210 and 1220 are equivalent. Thus, the overall parasitic capacitance (capacitor 1502) and resistance (resistor 1504) of transistor device 1210 may be compared to the overall parasitic capacitance (capacitor 1600) and resistance (resistor 1602) of transistor device 1210 combined with transistor device 1220. The relationship between the overall parasitic capacitance (capacitor 1502) of transistor device 1210, defined as $Co_{1502}$, to the overall parasitic capacitance (capacitor 1600) of transistor device 1210, defined as $C_{1600}$, to may be summarized by the following equation,:

$$C_{1600} = 2 * C_{1502} \qquad \text{(Equation 2)}$$

The relationship between the overall parasitic resistance (resistor 1504) of transistor device 1210, defined as $R_{1504}$, to the overall parasitic resistance (resistor 1602) of transistor device 1210, defined as R1602, may be summarized by the following equation:

$$R_{1602} = R_{1504}/3 \qquad \text{(Equation 2)}$$

In designing transistor-based switches, the nature of the inverse relationship between resistance and capacitance, makes it difficult to minimize effective resistance, while also minimizing effective capacitance. For example, as demonstrated above, in prior art transistor-based switches, reducing the effective resistance of the switched capacitor disadvantageously produces a nearly equivalent increase in the effective capacitance. Similarly, reducing the equivalent capacitance disadvantageously produces a nearly equivalent increase in the effective resistance. On the contrary, by the addition of transistor device 1220, transistor circuit 1200 enables the equivalent resistance of transistor circuit 1200 to be reduced, for example, by a factor of 3, while the equivalent capacitance may only be increased by a smaller factor, for example, by a factor of 2. As a result, transistor circuit 1200 provides a flexible mechanism for minimizing the parasitic effects of transistor devices 1210 and 1212.

While various embodiments of the invention have been described, it will be apparent to those of ordinary skill in the art that many more embodiments and implementations are possible that are within the scope of this invention.

What is claimed is:

1. A transistor circuit for implementing a differential switch, comprising:

a first switch node configured to connect to an external circuit;

a second switch node configured to connect to the external circuit;

a first transistor device having a first terminal connected to the first switch node, a second terminal, and a third terminal configured to receive a control signal that controls the electrical connectivity between the first terminal and the second terminal;

a second transistor device having a first terminal connected to the second terminal of the first transistor device, a second terminal connected to the second switch node, and a third terminal configured to receive the control signal; and a third transistor device having a first terminal connected to the first terminal of the first transistor device, a second terminal connected to the second terminal of the second transistor device, and a third terminal configured to receive the control signal, the third transistor device configured with predetermined parasitic characteristics that improve the effect of the parasitic characteristics of the transistor circuit when the control signal enables the first transistor device, the second transistor device, and the third transistor device.

2. The transistor circuit of claim 1, wherein the first transistor device, the second transistor device, and third transistor device are each a metal-oxide-semiconductor field-effect transistor.

3. The transistor circuit of claim 1, wherein the predetermined parasitic characteristics of the third transistor device reduce the effect of the parasitic resistance of the transistor circuit while sustaining a less than equivalent increase in the effect of the parasitic capacitance of the transistor circuit.

* * * * *